(12) United States Patent
Liu

(10) Patent No.: US 8,427,899 B2
(45) Date of Patent: Apr. 23, 2013

(54) SELF-ADAPTIVE SENSING DESIGN

(75) Inventor: Jack Liu, Taipie (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/281,966

(22) Filed: Oct. 26, 2011

(65) Prior Publication Data

US 2012/0106280 A1  May 3, 2012

Related U.S. Application Data

(60) Provisional application No. 61/408,164, filed on Oct. 29, 2010.

(51) Int. Cl.
*G11C 8/00* (2006.01)
*G11C 7/00* (2006.01)

(52) U.S. Cl.
USPC ............... 365/233.17; 365/194; 365/233.1

(58) Field of Classification Search ............. 365/233.17
See application file for complete search history.

(56) References Cited

U.S. PATENT DOCUMENTS

| 5,646,565 A * | 7/1997 | Tukidate ............... 327/174 |
| 5,687,134 A * | 11/1997 | Sugawara et al. .......... 365/233.1 |
| 6,252,820 B1 * | 6/2001 | Nakamura ............... 365/233.1 |
| 2011/0242912 A1 * | 10/2011 | Kang et al. ............. 365/194 |

* cited by examiner

*Primary Examiner* — Son Mai
(74) *Attorney, Agent, or Firm* — Lowe Hauptman Ham & Berner, LLP

(57) ABSTRACT

A clock signal having a clock pulse width duration is received. A delay time is received. A first relationship and a second relationship between the clock pulse width duration and the delay time are determined. A new clock is generated that has a first new clock pulse width duration determined by the first relationship and the delay time and a second new clock pulse width duration determined by the second relationship and the clock pulse width duration. Switching between the first new clock pulse width duration and the second new clock pulse width duration is automatic based on the first relationship and the second relationship.

20 Claims, 9 Drawing Sheets

SELF-ADAPTIVE SENSING DESIGN

CROSS-REFERENCE TO RELATED APPLICATIONS

The present application claims priority of U.S. Provisional Patent Application Ser. No. 61/408,164, filed on Oct. 29, 2010, which is incorporated herein by reference in its entirety.

FIELD

The present disclosure is related to a self-adaptive sensing design.

BACKGROUND

Sensing circuitry generally has two modes: a self-timed mode and a clock-based mode. In a self-timed mode, the pulse width of a word line is generated based on a delay time with reference to an edge of a clock. For example, a word line WL is generated based on a delay time with reference to a rising edge of clock CLK. For another example, after a time delay TWLR from the rising edge of clock CLK at time TCLKR, the rising edge of word line WL is generated, and after a time delay TWLF from time TCLKR, the falling edge of word line WL is generated. In effect, word line WL has a pulse width with a duration of TWLF-TWLR.

Similarly, after a delay time TSAER from time TCLKR, the rising edge of signal SAE is generated, and after a delay time TSAEF from time TCLKR, the falling edge of signal SAE is generated. As a result, signal SAE has a pulse width with a duration of TSAEF-TSAER. In other words, both the rising and the falling edges of word line WL and signal SAE are triggered from the rising edge of clock CLK. In addition, the pulse width of both word line WL and signal SAE are determined by an internal self-reset circuitry, which is highly sensitive to process, voltage, and temperature (PVT) variations. The self-timed mode, due to semiconductor manufacturing process changes, has become more difficult to track well with PVT process variations. Additionally, because the self-timed mode depends on the clock frequency, it is difficult to debug when failures occur. An inaccurate delay time model, for example, for times TWLR, TWLF, TSAER, TSAEL, etc., can cause frequency independent failures.

In a clock-based mode, the rising edge of word line WL is triggered by the rising edge of clock CLK while the falling edge of word line WL is triggered by the falling edge of clock CLK. As a result, the clock-based mode consumes a large amount of power at lower frequencies because word line WL, at low frequencies in some approaches, is activated for a longer period of time. The rising edge of signal SAE, on the other hand, is triggered by the falling edge of clock CLK while the falling edge of signal SAE is triggered by the rising edge of clock CLK in the subsequent cycle. Because of the triggering mechanism that uses two clock cycles, the system that generates signal SAE is not efficient.

In some approaches in which both the self-timed mode and the clock-based mode are used, a manual switch is used to switch between the self-timed mode and the clock-based mode, which is complicated and requires human intervention. For example, when the clock frequency is changed from a higher to a lower frequency, a user would need to shut off the clock, change the clock setting, and turn on the clock again.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
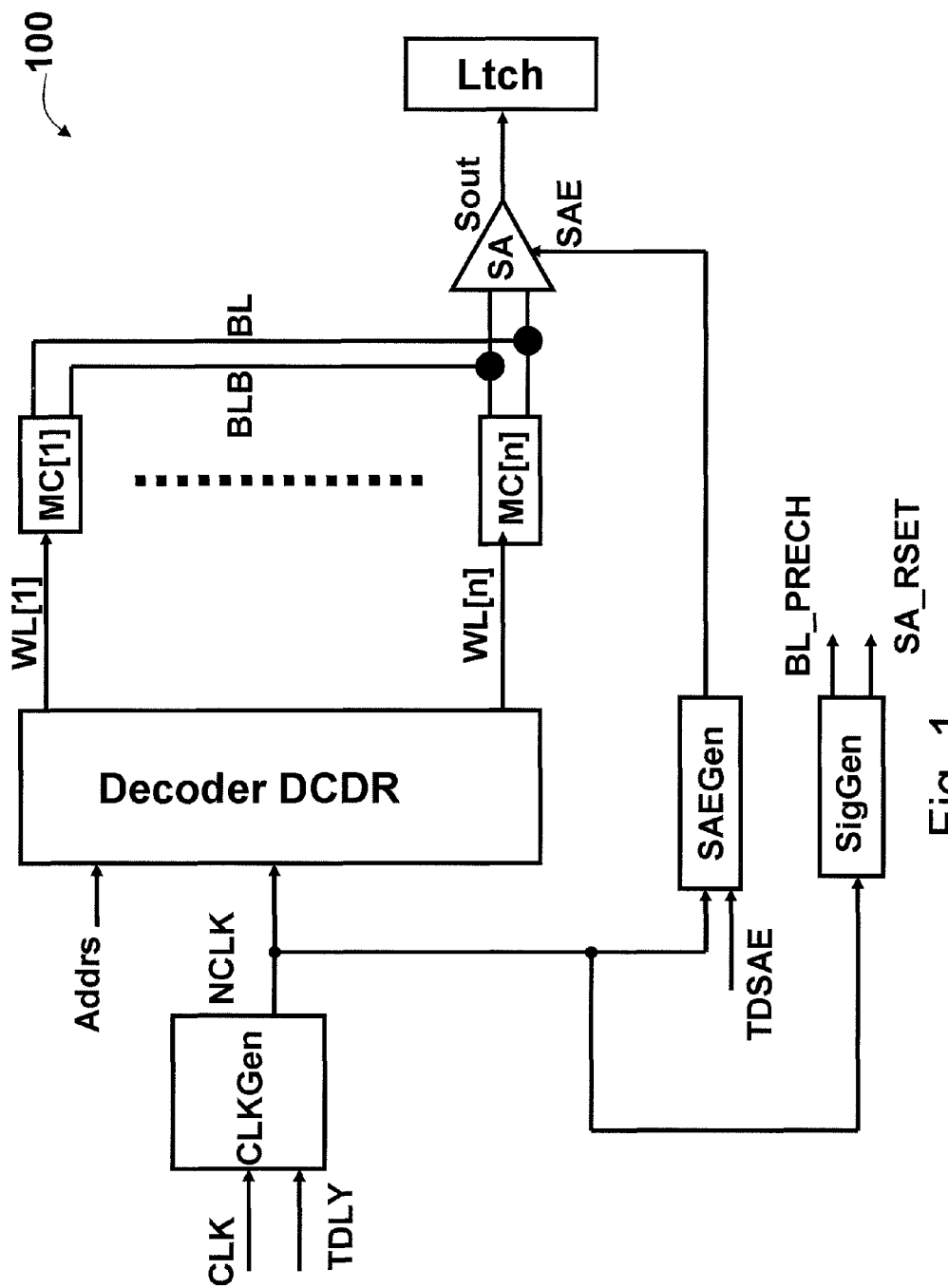
FIG. 1 is a diagram of an illustrative SRAM structure, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The SRAM operates in the high performance mode at higher frequencies, which reduces the PVT sensitivity. The SRAM, in contrast, operates in the power saving mode at lower frequencies to reduce power dissipation. Switching between the high performance mode and the power saving mode is automatic, i.e., without human intervention.

Exemplary Circuit

FIG. 1 is a diagram of an exemplary SRAM structure 100, in accordance with some embodiments. For illustration, SRAM structure 100 includes n memory cells MC[1] to MC[n] where n is an integer number.

Figure 3:
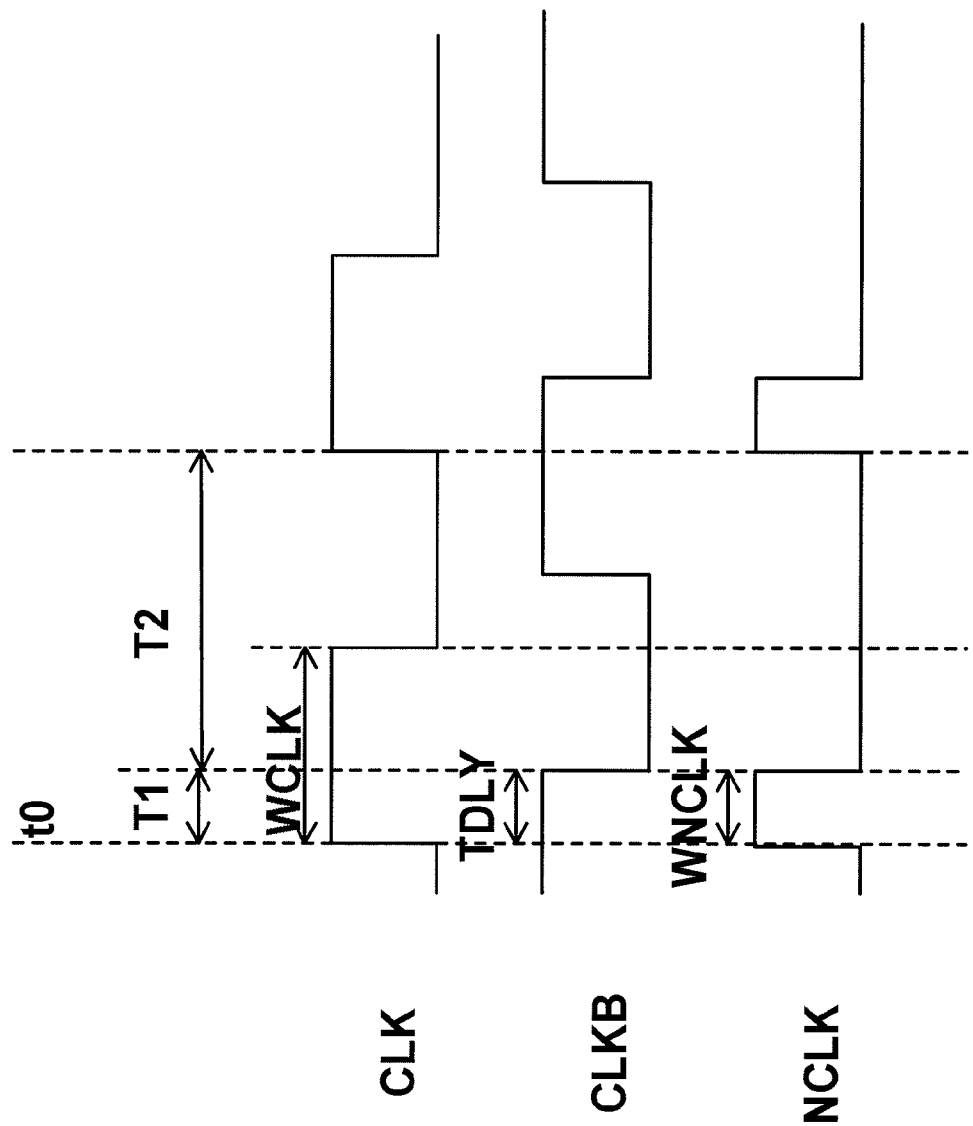
FIGS. 3 and 4 are graphs of waveforms illustrating the operation of circuit 200, in accordance with some embodiments.

Clock generator CLKGen is configured to receive as inputs clock CLK and a delay time TDLY, to generate a new clock NCLK. In some embodiments, clock CLK is provided by a system using SRAM 100 and is commonly called a system clock. In some embodiments, SRAM 100 operates in at least two modes, a high performance mode and a power saving mode. For example, if the pulse width WCLK of clock CLK illustrated in FIG. 3 is less than time TDLY, circuit 100 operates in the power saving mode. If, however, pulse width WCLK is greater than delay time TDLY, circuit 100 operates in the high performance mode. Further, switching between the high performance mode and the power saving mode is automatic or "self-adaptive." For example, when a memory cell MC[i] is selected for reading, clock NCLK, the corresponding word line WL[i], and signal SAE are generated for sense amplifier SA to function normally. For a further example, pulse width WCLK is less than delay time TDLY for SRAM 100 to operate in the power saving mode. When circumstances change, such as when the operational voltage of SRAM 100 is increased for a high-demand energy mode, pulse width WCLK is increased such that pulse width WCLK is greater than delay time TDLY. As a result, SRAM 100 automatically switches to the high performance mode based on the nature of how clock NCLK, word line WL[i] and signal SAE are generated, in accordance with some embodiments. If circumstances change again such that pulse width WCLK is less than delay time TDLY, SRAM 100 automatically switches to the power saving mode, etc.

Decoder DCDR, based on address Addrs, selects a corresponding word line WL from n word lines WL[1] to WL[n] for a corresponding memory cell MC to be read. In some embodiments, a selected word line WL has the same waveform or the same image as that of clock NCLK. For example, decoder DCDR passes clock NCLK through decoder DCDR to become the selected word line WL. For another example, if word line WL[1] is selected for reading, then word line WL[1] has the same waveform as that of clock NCLK. If word line WL[2] is selected for reading, word line WL[2] has the same waveform as that of clock NCLK, etc. Decoder DCDR is commonly called a word line generating circuit.

A pair of bit lines BL and BLB carries the data that represents the data to be read for a selected memory cell MC. For example, prior to reading data for the selected memory cell MC, bit lines BL and BLB corresponding to the memory cell MC to be read are pre-charged to a high logical value. The data stored in the selected memory cell MC to be read then causes a differential signal between bit lines BL and BLB to be developed. The differential signal is commonly called a bit line split. After the bit line split is sufficiently developed, sense amplifier SA is invoked to sense the data, i.e., to provide the data that reflects the data stored in memory cell MC. In some embodiments, sensing would fail if there is not a sufficient bit line split. As a result, delay time TDLY is selected such that the bit line split has sufficient time to develop and for sense amplifier SA to function properly. For example, based on a bit line split of DIFF_BL_BLB (not labeled) for a specified technology, a corresponding time TDLY is calculated. Bit line split DIFF_BL_BLB varies depending on the technology, and is about 100 mV in some embodiments.

Control signal generating circuit SAEGen receives clock NCLK and delay time TDSAE as inputs and generates signal SAE for use by sense amplifier SA, which will be explained in details with reference to FIG. 6. Signal SAE when activated enables sense amplifier SA to sense the data. For example, when the differential signal between bit lines BL and BLB for the selected memory cell MC is sufficiently developed, signal SAE is activated for sense amplifier SA to sense the data. Signal SAE is deactivated when sensing is complete, e.g., when the data output Sout of sense amplifier SA has been latched through latch Ltch. Signal SAE is generated such that, together with the selected word line WL for the corresponding memory cell MC, circuit 100 automatically switches between the high performance mode and the power saving mode.

Latch circuit Ltch latches data Sout to be processed accordingly to reflect the data read from the selected memory cell MC.

Signal generating circuit SigGen receives clock NCLK as an input and generates signals BL_PRECH and SA_RSET. In some embodiments, signal BL_PRECH indicates whether bit lines BL and BLB associated with the selected memory cell MC to be read are in the pre-charge mode. For example, in some embodiments, signal BL_PRECH is logically low during the pre-charge period and is logically high when the difference between bit line BL and bit line BLB is being developed. In some embodiments, signal SA_RSET indicates whether sense amplifier SA is in the reset mode. For example, in some embodiments, signal SA_RSET being logically low indicates that sense amplifier SA is in the reset mode. In contrast, signal SA_RSET being logically high indicates sense amplifier SA is not in the reset mode. For example, sense amplifier SA is in the waiting-for-sensing mode or is in the sensing mode.

In FIG. 1, a word line WL is shown corresponding to one memory cell MC for illustration. A word line WL, however, corresponds to a plurality of memory cells on the same row, in accordance with some embodiments. Further, in FIG. 1, an SRAM is used for illustration. Various embodiments are not so limited. Clock NCLK, word lines WL, signal SAE, etc., can be used for sensing various different circuitries.

Clock Generating Circuits and Waveforms

Figure 2:
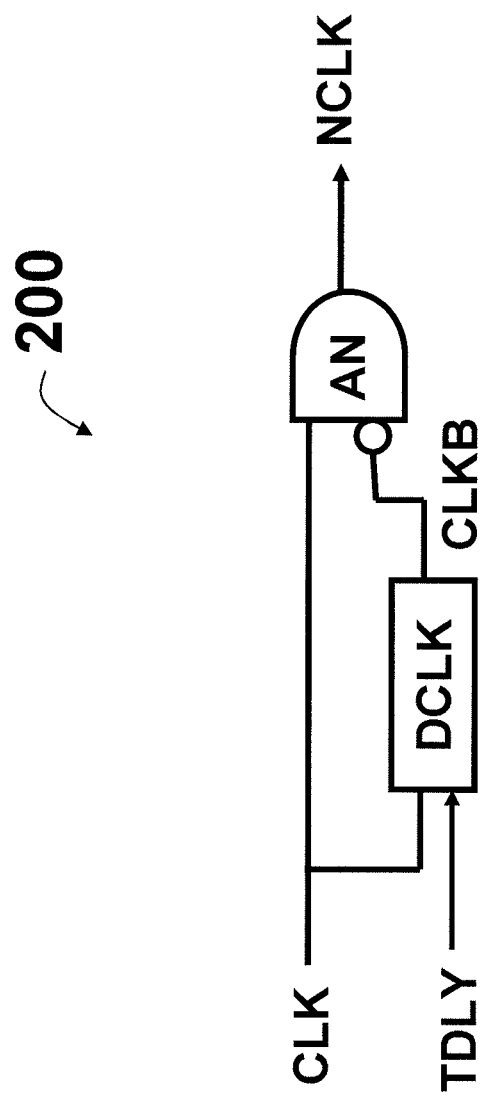
FIG. 2 is a diagram of a circuit used to generate clock NCLK in the structure of FIG. 1, in accordance with some embodiments.

FIG. 2 is a diagram of a circuit 200 illustrating an embodiment of circuit CLKGen that generates clock NCLK, in accordance with some embodiments. Circuit DCLK generates clock CLKB based on clock CLK and delay time TDLY such that clock CLKB is the inverse of clock CLK delayed by delay time TDLY. In other words, in one clock cycle, clock CLKB has the same waveform as clock CLK from the rising of clock CLK and during delay time TDLY. Clock CLKB, however, is the inverse logic of clock CLK after delay time TDLY. Clock NCLK is the result of an AND function of clock CLK and clock CLKB through AND gate AN.

Figure 7:
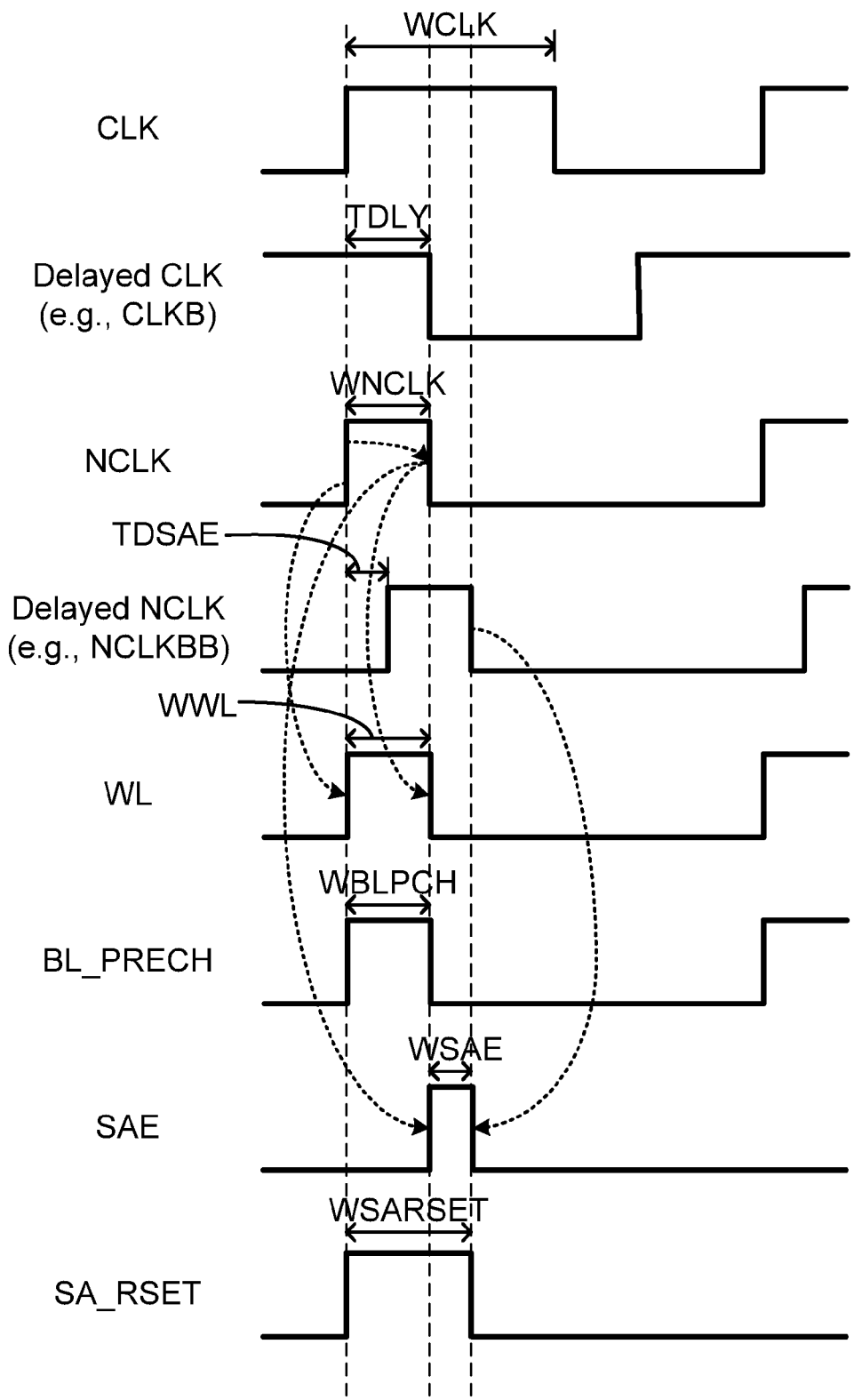
FIG. 7 is a graph of waveforms illustrating how various signals are generated when the pulse width of clock CLK in FIG. 2 is less than the delay time, in accordance with some embodiments.

FIG. 3 is a graph of waveforms illustrating the operation of circuit 200, in accordance with some embodiments. Pulse width WCLK is the positive pulse width of clock CLK and represents the time clock CLK is logically high in a clock cycle. Delay time TDLY is referenced from the rising edge of clock CLK at time t0. Clock CLKB is inverted from clock CLK delayed by delay time TDLY. Pulse width WNCLK is the positive pulse width of clock NCLK and represents the time clock NCLK is logically high in a clock cycle. In some embodiments, delay time TDLY is set to ensure that the pulse width of the corresponding word line WL is sufficiently wide for sense amplifier SA to sense correctly. For example, pulse width WWL illustrated in FIG. 7 is sufficiently wide for the bit line split to be sufficiently developed. In some embodiments, adjustable delay time TDLY is used to adjust pulse width WWL. Various mechanisms to program or adjust delay time TDLY are within the scope of various embodiments.

In various embodiments, pulse width WNCLK varies depending on the relationship between time delay TDLY and the duration of pulse width WCLK. The waveforms of FIG. 3 illustrate the operation of circuit 200 when time delay TDLY is less than the duration of pulse width WCLK. In contrast, the waveforms of FIG. 4 illustrate the operation of circuit 200 when time delay TDLY is greater than the duration of pulse width WCLK.

In FIG. 3, during time period T1, which is also the delay time TDLY, both clock CLK and clock CLKB are logically high. Because both clock CLK and clock CLKB are logically high, clock NCLK is logically high through the operation of AND gate AN. In effect, clock NCLK has pulse width WNCLK that is logically high during delay time TDLY. During time period T2, clock NCLK is logically low, because clock CLK and/or clock CLKB is logically low.

Figure 4:
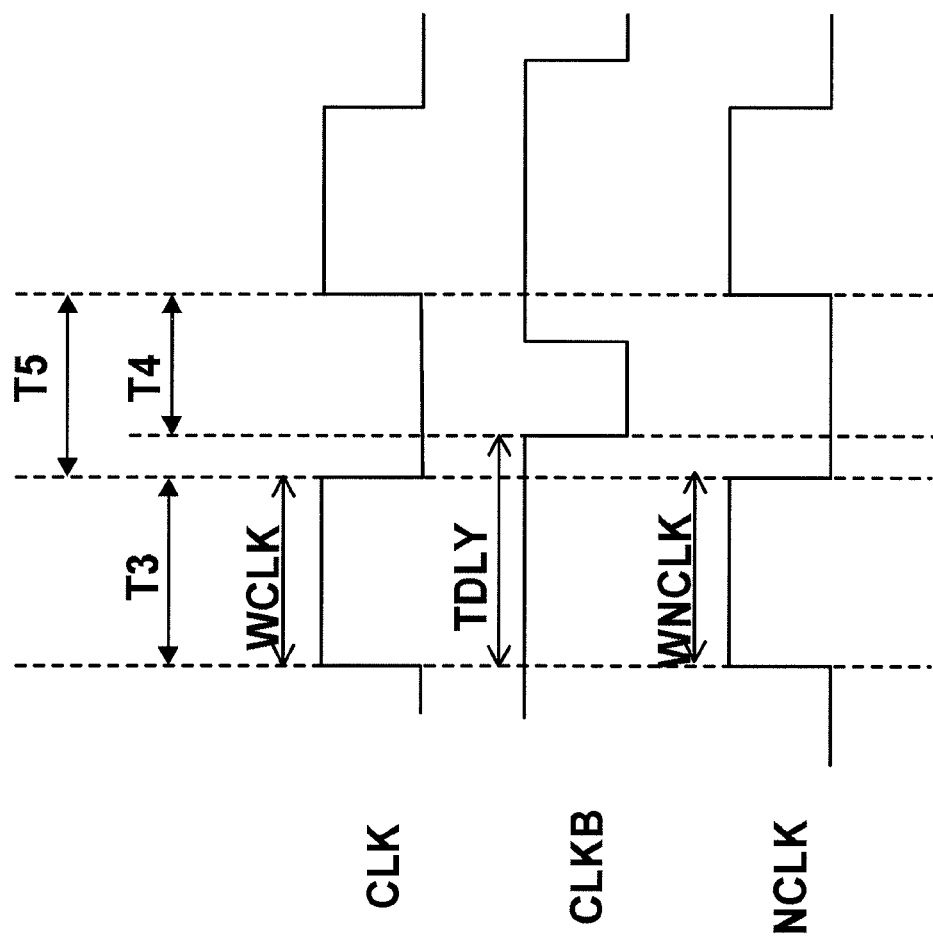

FIG. 4 is a graph of waveforms illustrating the operation of circuit 200 in which delay time TDLY is greater than the duration of pulse width WCLK. In this illustration, during time T3, which is within delay time TDLY from the rising edge of clock CLK, clock CLKB is logically hihg as is clock CLK. In some embodiments, during time period T4, which starts after clock CLKB turns logically low, clock CLKB is reset to turn logically high. In time period T3, because both clock CLK and clock CLKB are logically, pulse width WNCLK is logically high. During time period T5, clock NCLK is logically low because clock CLK and/or clock CLKB is logically low. As a result, clock NCLK has the same waveform as clock WCLK during time periods T3 and T5. In effect, clock NCLK has the same image as that of clock WCLK.

As illustratively shown in FIG. 3 and FIG. 4, in some embodiments, the duration of pulse width WNCLK is equal to time delay TDLY when the duration of pulse width WCLK is greater than delay time TDLY and is equal to the duration of pulse width WCLK when the duration of pulse width WCLK is less than delay time TDLY.

In some embodiments, as the frequency of clock CLK changes, pulse width WCLK changes. As a result, pulse width WNCLK changes accordingly. For example, initially pulse width WCLK is greater than delay time TDLY, and if pulse width WCLK decreases but remains greater than delay time TDLY, pulse width WNCLK remains equal to time delay TDLY. But if pulse width WCLK changes to be less than time TDLY, pulse width WNCLK changes to be the same as pulse width WCLK, etc.

Figure 5:
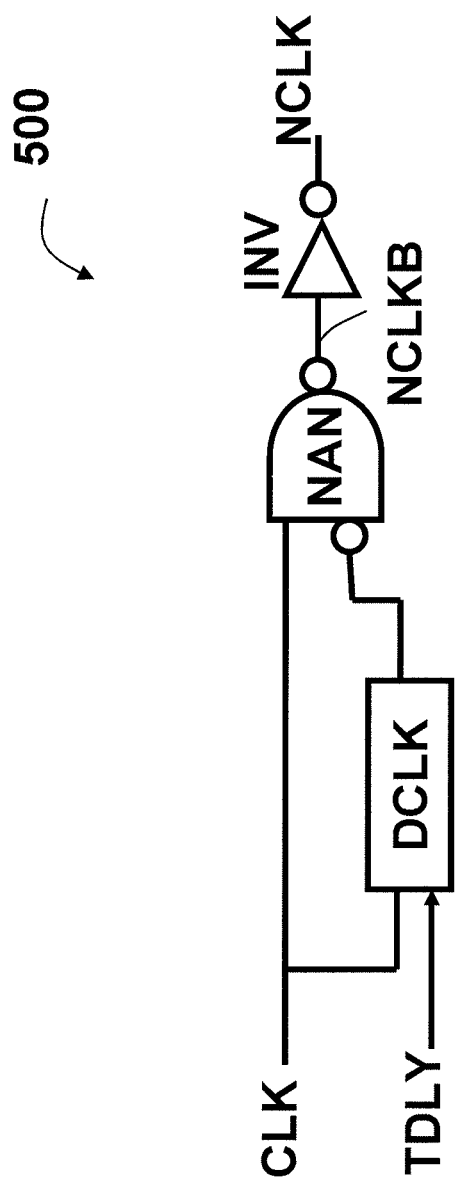
FIG. 5 is a diagram of a circuit used to generate clock NCLK, in accordance with some further embodiments.

FIG. 5 is a diagram of circuit 500 illustrating some further embodiments of circuit CLKGen. Compared with circuit 200, NAND gate NAN and inverter INV in FIG. 5 replace AND gate AN in circuit 200. As a result, clock NCLKB is the inverse of clock NCLK. The operation of circuit 500 is similar to the operation of circuit 200 and is recognizable by persons of ordinary skill in the art.

Control Signal SAE Generating Circuit

Figure 6:
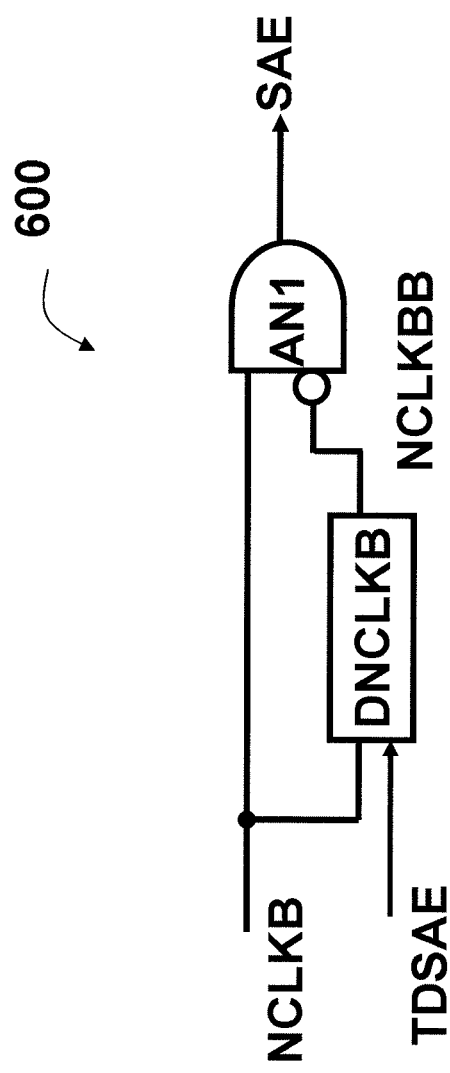
FIG. 6 is a diagram of an illustrative circuit used to generate signal SAE of the circuit in FIG. 2, in accordance with some embodiments.

FIG. 6 is a diagram a circuit 600 illustrating an implementation of circuit SAEGen in SRAM 100 that generates signal SAE, in accordance with some embodiments. Circuit DNCLKB receives clock NCLKB and delay time TDSAE as inputs and generates clock NCLKBB in the same manner as circuit DNCLK in circuit 200 that generates clock CLKB based on clock CLK. AND gate AN1 receives clock NCLKB and clock NCLKBB as inputs and generates signal SAE in the same manner as AND gate AN generating word line WL based on clock CLK and clock CLKB in FIG. 2. Those of ordinary skill in the art will recognize that signal SAE, in effect, is triggered by the falling edge of clock NCLK, and the pulse width of signal SAE is determined by delay time TDSAE. The pulse width of signal SAE is illustratively shown as pulse width WSAE in FIG. 7. In some embodiments, delay time TDSAE is selected such that sense amplifier SA has sufficient time to evaluate the received data, i.e., for sense amplifier SA to have sufficient time to amplify the differential signal between bit lines BL and BLB to a full-swing signal.

Additional Illustrative Waveforms

FIG. 7 is a graph of waveforms illustrating relationships of various waveforms when pulse width WCLK is greater than delay time TDLY, in accordance with some embodiments.

Signal BL_PRECH indicates whether bit lines BL and BLB are in the pre-charge mode. For example, in some embodiments, signal BL_PRECH is logically low during the pre-charge period and is logically high when the difference between bit line BL and bit line BL is being developed.

Signal SA_RSET indicates whether sense amplifier SA is in the reset mode. For example, in some embodiments, signal SA_RSET being logically low indicates that sense amplifier SA is in the reset mode, and signal SA_RSET being logically high indicates sense amplifier SA is not in the reset mode, e.g., is in the waiting-for-sensing mode or is in the sensing mode.

In FIG. 7, because pulse width WCLK is greater than delay time TDLY, the duration of pulse width WNCLK is the same as the duration of delay time TDLY. In some embodiments, the pulse width WWL of word line WL is the same as pulse width WNCLK or delay time TDLY. The pulse width WBLPCH of signal BL_PRECH has the same time duration as pulse width WNCLK. The pulse width WSAE of signal SAE starts at the falling edge of clock CLK and has a duration of delay time TDSAE. Signal SA_RSET has a pulse width WSARSET with a duration that is the result of a logical OR operation of word line WL and signal SAE. In other words, signal SA_RSET is logically hihg when signal WL and/or signal SAE is logically high.

As shown in FIG. 7, the rising edge of word line WL is triggered by the rising edge of clock NCLK. The falling edge of word line WL is triggered by the falling edge of clock NCLK, which is delayed by a delay time TDLY with respect to the rising edge of clock NCLK. The rising edge of signal SAE is triggered by the falling edge of clock NCLK. The falling edge of signal SAE, however, is triggered by delay time TDSAE, instead of being triggered by the rising edge of clock NCLK as in the traditional self-time mode. In the situation of FIG. 7, circuit 100 is said to operate in the high performance mode.

Figure 8:
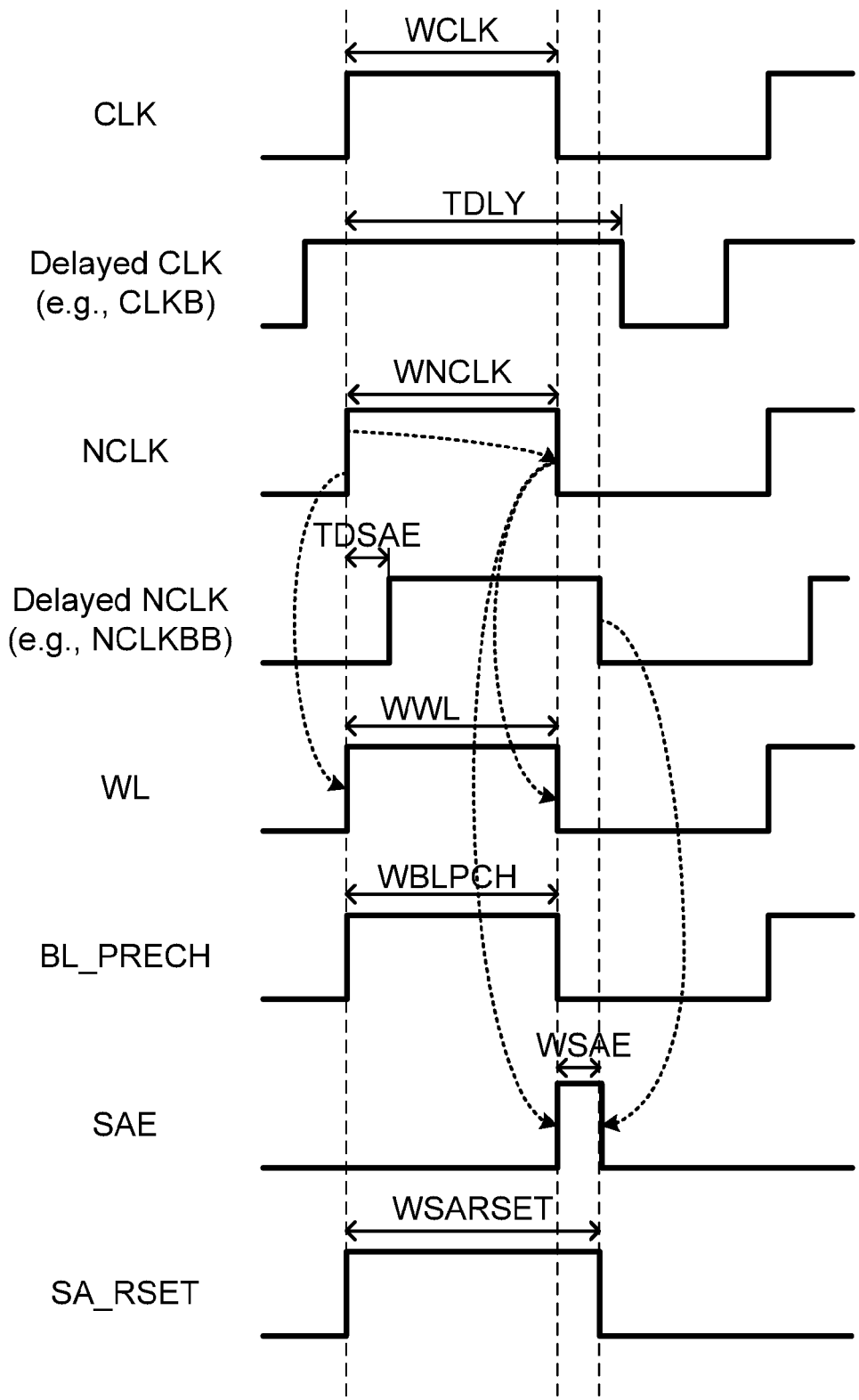
FIG. 8 is a graph of waveforms illustrating how various signals are generated when the pulse width of clock CLK in FIG. 2 is greater than the delay time, in accordance with some embodiments.

FIG. 8 is a graph of waveforms illustrating the relationship of various waveforms when pulse width WCLK is less than delay time TDLY, in accordance with some embodiments. Because pulse width WCLK is less than delay time TDLY, the duration of pulse width WNCLK is the same as the duration of pulse width WCLK. The duration of pulse with WWL is the same as the duration of pulse width WNCLK or pulse width WCLK. The duration of pulse width WBLPCH is the same as the duration of pulse width WWL. Pulse width WSAE starts at the falling edge of clock NCLK and has a duration of delay time TDSAE. Pulse width WSARSET is the result of a logical OR operation of word line WL and signal SAE. In other words, signal SA_RSET is logically high when signal WWL and/or signal WSAE is logically high.

As shown in FIG. 8, the rising edge of word line WL is triggered by the rising edge of clock NCLK. The falling edge of clock NCLK is triggered by the falling edge of clock NCLK. The rising edge of signal SAE is triggered by the falling edge of clock NCLK. The falling edge of signal SAE, however, is triggered by delay time TDASE, instead of being triggered by the next rising edge of clock NCLK in the next cycle as in the traditional clock-based mode. In the situation of FIG. 8, circuit 100 is said to operate in the power saving mode.

Exemplary Method

Figure 9:
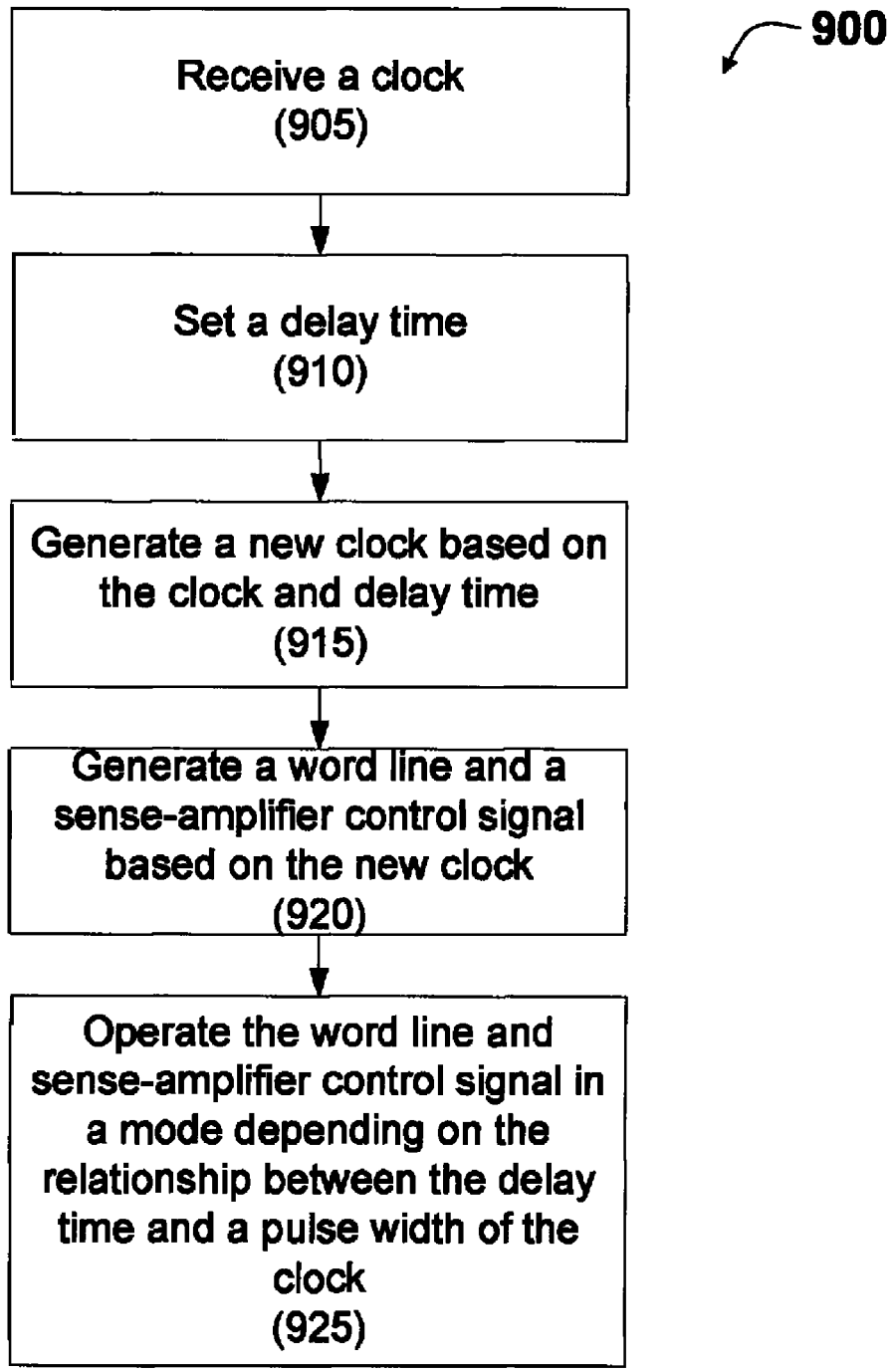
FIG. 9 is a flowchart illustrating the operation of the SRAM FIG. 2, in accordance with some embodiments.

FIG. 9 is a flowchart 900 illustrating a method of sensing a memory cell MC[i] (not shown), in FIG. 1, in accordance with some embodiments.

In step 905, clock CLK is received, e.g., from a system using circuit 200 in FIG. 2.

In step 910, delay time TDLY is set, based on a selected sensing design. For example, delay time TDLY is set based on a minimum bit line split specified for the particular sense amplifier for a particular technology node such as 40 nm, 28 nm, etc.

In step 915, clock NCLK is generated, e.g., based on clock CLK, delay time TDLY, and circuit 200.

In step 920, a word line corresponding to memory cell MC[i] to be read and signal SAE are generated. For example, the word line is word line WL[i], corresponding to memory cell MC[i]. Word line WL[i] and signal SAE are generated based on clock NCLK and circuit 600 shown in FIG. 6, in accordance with some embodiments.

In step 925, when sensing the data of memory cell MC[i] through a corresponding pair of bit lines BL and BLB, memory structure 100 is in the high performance mode or in the power saving mode, depending on the relationship between pulse width WCLK of clock CLK and delay time TDLY. For illustration purposes, structure 100 is in the power saving mode because pulse width WCLK is less than delay time TDLY. For another example, another memory MC[k] is later read, and circumstances, however, have changed that pulse width WCLK is now greater than delay time TDLY. As a result, circuit 100 is now in the high performance mode. Switching from the power saving mode to the high performance mode is automatic, in accordance with some embodiments.

A number of embodiments have been described. It will nevertheless be understood that various modifications may be made without departing from the spirit and scope of the disclosure. For example, the logical value (low or high) of various signals and clocks used in the above description is for illustration purposes. Various embodiments are not limited to a particular value when a signal and/or clock is activated and/or deactivated. In FIG. 9, switching from the power saving mode to the high performance mode is used for illustration. Switching from the self-time mode to the power saving mode is also automatic. In other words, switching between the power saving mode and high performance mode is automatic, in accordance with some embodiments.

Some embodiments regard methods comprising: receiving a clock signal having a clock pulse width duration; receiving a delay time value; determining a first relationship and a second relationship between the clock pulse width duration and the delay time value; and generating a new clock signal having a first new clock pulse width duration determined by the first relationship and the delay time value and a second new clock pulse width duration determined by the second relationship and the clock pulse width duration. Switching between the first new clock pulse width duration and the second new clock pulse width duration is automatic based on the first relationship and the second relationship.

Some embodiments regard circuits that comprise: a clock generating circuit, a word line generating circuit, and a sense amplifier control signal generating circuit. The clock generating circuit is configured to receive a clock delay time and a clock having a clock pulse width and to generate a new clock having a new clock pulse width based on a first relationship and a second relationship between the clock pulse width and the delay time. The new clock pulse width has a first pulse width based on the delay time and the first relationship and a second pulse width based on the clock pulse width and the second relationship. The word line generating circuit is configured to receive the new clock and to generate a word line having an image of the new clock. The sense amplifier control signal generating circuit is configured to receive the new clock and a signal delay time to generate a sense amplifier control signal for use in controlling a sense amplifier.

Some embodiments regard methods that comprise: receiving a clock signal having a clock pulse width duration; receiving a clock delay time; determining a first relationship and a second relationship between the clock pulse width duration and the delay time; generating a new clock having a first new clock pulse width duration determined by the first relationship and the delay time and a second new clock pulse width duration determined by the second relationship and the clock pulse width duration; receiving a signal delay time; and generating a control signal triggered by an edge of the new clock and having a pulse width duration of the signal delay time.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A method comprising:
   receiving a clock signal having a clock pulse width duration;
   receiving a delay time value;
   determining a first relationship and a second relationship between the clock pulse width duration and the delay time value; and
   generating a new clock signal having a first new clock pulse width duration determined by the first relationship and the delay time value and a second new clock pulse width duration determined by the second relationship and the clock pulse width duration,
   wherein switching between the first new clock pulse width duration and the second new clock pulse width duration is automatic based on the first relationship and the second relationship.

2. The method of claim 1 wherein:
   the first new clock pulse width duration is the same as the delay time value when the clock pulse width duration is greater than the delay time value; and
   the second new clock pulse width duration is the same as the clock pulse width duration when the clock pulse width duration is less than the delay time value.

3. The method of claim 1 wherein generating the new clock signal comprises:
   inverting the clock after a duration equal to the delay time value to form a delayed inverted clock signal; and
   performing a logical AND operation on the clock signal and the delayed inverted clock signal.

4. The method of claim 1 further comprising:
   generating a word line signal, which is the same as the new clock pulse width, for use in a memory array.

5. The method of claim 1 further comprising generating a sense amplifier control signal by:
   inverting the new clock signal to form an inverted new clock signal;
   inverting the inverted new clock signal after a second delay time duration to form a re-inverted new clock signal and performing a logical AND operation on the inverted new clock signal and the re-inverted new clock signal.

6. The method of claim 5, wherein the second delay time duration is selected based on a time for a sense amplifier to amplify a differential signal to a full-swing signal.

7. The method of claim 1 further comprising generating a bit line pre-charge signal, which is the same as the new clock signal.

8. The method of claim 1 further comprising generating a sense amplifier reset signal by:
  generating a bit line pre-charge signal, which is the same as the new clock signal;
  generating a sense amplifier control signal, wherein generating the sense amplifier control signal includes
  inverting the new clock signal to form an inverted new clock signal;
  inverting the inverted new clock signal after a second delay time duration to form a re-inverted new clock signal; and
  performing a logical AND operation between the inverted new clock signal and the re-inverted new clock signal; and
  performing a logical OR operation on the bit line pre-charge signal and the sense amplifier control signal.

9. The method of claim 1 further comprising selecting the delay time value based on a specified bit line split.

10. A circuit comprising:
  a clock generating circuit configured to receive a clock delay time value and a clock signal having a clock pulse width and to generate a new clock signal having a new clock pulse width based on a first relationship and a second relationship between the clock pulse width and the clock delay time value; the new clock pulse width having a first pulse width based on the clock delay time value and the first relationship and a second pulse width based on the clock pulse width and the second relationship;
  a word line generating circuit configured to receive the new clock signal and to generate a word line signal, which is the same as the new clock signal; and
  a sense amplifier control signal generating circuit configured to receive the new clock signal and a signal delay time value to generate a sense amplifier control signal for use in controlling a sense amplifier.

11. The circuit of claim 10, wherein the sense amplifier control signal has a pulse width with a duration of the signal delay time value.

12. The circuit of claim 10, wherein the clock generating circuit includes:
  a delayed inverting circuit configured to invert the clock signal after a duration of the clock delay time value to generate a second clock signal; and
  an AND gate configured to receive the clock signal and the second clock signal to generate the new clock signal.

13. The circuit of claim 10, wherein the sense amplifier control signal generating circuit includes:
  an inverting circuit configured to receive an inverse of the new clock signal and the signal delay time value to generate a second clock signal based on the inverse of the new clock signal and the signal delay time value; and
  an AND gate configured to receive the second clock signal and the inverse of the new clock signal to form the sense amplifier control signal.

14. The circuit of claim 10 further comprising a signal generating circuit configured to receive the new clock signal and generate a bit line pre-charge signal, which is the same as the new clock signal.

15. The circuit of claim 10 further comprising a signal generating circuit configured to receive the new clock signal and generate a sense amplifier reset signal having a reset pulse width resulted from an OR operation of the sense amplifier control signal and a bit line pre-charge signal, which is the same as the new clock signal.

16. The circuit of claim 10, wherein the clock delay time value is sufficient for a bit line split to develop to a specified value.

17. A method comprising:
  receiving a clock signal having a clock pulse width duration;
  receiving a clock delay time value;
  determining a first relationship and a second relationship between the clock pulse width duration and the clock delay time value;
  generating a new clock signal having a first new clock pulse width duration determined by the first relationship and the clock delay time value and a second new clock pulse width duration determined by the second relationship and the clock pulse width duration;
  receiving a signal delay time value; and
  generating a control signal triggered by an edge of the new clock signal and having a pulse width duration of the signal delay time value.

18. The method of claim 17, wherein switching between the first new clock pulse width duration and the second new clock pulse width duration is automatic based on the first relationship and the second relationship.

19. The method of claim 17 further comprising selecting the clock delay time value based on a first requirement for a bit line split to develop and selecting the signal delay time value based on a second requirement for amplifying the bit line split.

20. The circuit of claim 17 further comprising generating a word line signal, which is the same as the new clock signal.

* * * * *